(12) United States Patent
Yoon et al.

(10) Patent No.: US 11,357,142 B2
(45) Date of Patent: Jun. 7, 2022

(54) ELECTRONIC DEVICE INCLUDING A SHIELDING SHEET AND A HEAT RADIATION MEMBER

(71) Applicant: Samsung Electronics Co., Ltd., Suwon-si (KR)

(72) Inventors: Hyunjoong Yoon, Suwon-si (KR); Myunghoon Kwak, Suwon-si (KR); Minki Park, Suwon-si (KR); Youngjae You, Suwon-si (KR); Yongsang Yun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/899,118

(22) Filed: Jun. 11, 2020

(65) Prior Publication Data

US 2021/0029855 A1 Jan. 28, 2021

(30) Foreign Application Priority Data

Jul. 25, 2019 (KR) .......................... 10-2019-0090425

(51) Int. Cl.
*H05K 9/00* (2006.01)
*H05K 7/20* (2006.01)
(Continued)

(52) U.S. Cl.
CPC ....... *H05K 9/0022* (2013.01); *H01L 23/4006* (2013.01); *H01L 23/552* (2013.01);
(Continued)

(58) Field of Classification Search
CPC .... H05K 1/0203; H05K 9/0024; H05K 9/003; H05K 9/0032; H05K 7/20336;
(Continued)

(56) References Cited

U.S. PATENT DOCUMENTS 6,014,315 A * 1/2000 McCullough ......... H01L 23/367
165/80.2
6,377,475 B1 * 4/2002 Reis ..................... H05K 9/0035
361/818
(Continued)

FOREIGN PATENT DOCUMENTS

DE 4326825 A1 * 6/1994 .......... H05K 9/0024
JP 2005-064266 A 3/2005
(Continued)

OTHER PUBLICATIONS

English translation of Yamaguchi, JP-2005064266-A, Mar. 2005, translated on May 26, 2021 (Year: 2021).*
(Continued)

*Primary Examiner* — Robert J Hoffberg
(74) *Attorney, Agent, or Firm* — Jefferson IP Law, LLP

(57) ABSTRACT

An electronic device having a shielding structure disposed around electronic components and having high heat dissipation performance is provided. The electronic device includes a circuit board, at least one electronic component mounted on a surface of the circuit board, a shielding sheet attached to the surface of the circuit board to cover the at least one electronic component, a thermal interface material stacked on the shielding sheet to overlap the at least one electronic component, and a heat dissipation member disposed to face the surface of the circuit board, being in surface contact with the thermal interface material, and fastened to at least a portion of the circuit board by a fixing member. Various other embodiments may be possible.

17 Claims, 10 Drawing Sheets

(51) Int. Cl.
*H01L 23/40* (2006.01)
*H05K 1/02* (2006.01)
*H01L 23/552* (2006.01)

(52) U.S. Cl.
CPC ......... *H05K 1/0203* (2013.01); *H05K 7/2049* (2013.01); *H05K 7/20336* (2013.01); *H05K 7/20472* (2013.01); *H05K 7/20509* (2013.01); *H05K 9/0032* (2013.01); *H05K 9/0024* (2013.01)

(58) Field of Classification Search
CPC ............. H05K 7/20472; H05K 7/2049; H05K 7/20509; H05K 9/0022–0037; H01L 23/4006; H01L 23/552
See application file for complete search history.

(56) References Cited

U.S. PATENT DOCUMENTS

| | | | |
|---|---|---|---|
| 6,744,640 B2* | 6/2004 | Reis | H01L 23/552 361/818 |
| 7,245,896 B2* | 7/2007 | Seo | H01Q 1/02 174/377 |
| 8,115,117 B2* | 2/2012 | Kapusta | H05K 9/0043 174/386 |
| 8,493,749 B2* | 7/2013 | Myers | H05K 3/284 361/818 |
| 8,654,543 B2 | 2/2014 | Lee et al. | |
| 9,436,235 B2* | 9/2016 | Damaraju | H01L 23/427 |
| 9,793,223 B2* | 10/2017 | Yoo | H01L 21/56 |
| 9,877,380 B2* | 1/2018 | Wanner | H05K 1/0203 |
| 10,104,763 B2* | 10/2018 | Lee | H05K 7/20454 |
| 10,542,630 B2* | 1/2020 | Pahl | H01L 23/10 |
| 10,652,996 B2* | 5/2020 | Chiu | H05K 3/284 |
| 2003/0193794 A1 | 10/2003 | Reis et al. | |
| 2004/0247925 A1* | 12/2004 | Cromwell | H05K 7/1061 428/548 |
| 2013/0082367 A1* | 4/2013 | Yoo | H01L 23/552 257/659 |
| 2017/0135240 A1* | 5/2017 | Pahl | H01L 23/10 |
| 2017/0181266 A1 | 6/2017 | Hunt et al. | |
| 2018/0131087 A1 | 5/2018 | Kim et al. | |
| 2018/0146539 A1 | 5/2018 | Zhang et al. | |
| 2018/0288908 A1 | 10/2018 | Lee et al. | |
| 2019/0043779 A1 | 2/2019 | Chung et al. | |
| 2019/0067157 A1 | 2/2019 | Lin et al. | |
| 2019/0364695 A1 | 11/2019 | Lee et al. | |
| 2020/0137931 A1* | 4/2020 | Lee | H05K 7/20509 |
| 2021/0399413 A1* | 12/2021 | Liao | H01Q 1/02 |

FOREIGN PATENT DOCUMENTS

| | | | |
|---|---|---|---|
| JP | 2012-084599 A | 4/2012 | |
| KR | 10-2017-0097541 A | 8/2017 | |
| KR | 10-2017-0100975 A | 9/2017 | |
| KR | 10-1831359 B1 | 2/2018 | |
| KR | 10-2019-0060180 A | 6/2019 | |
| WO | WO-02096177 A2 * | 11/2002 | .......... H05K 1/0218 |
| WO | 2016/192069 A1 | 12/2016 | |

OTHER PUBLICATIONS

International Search Report dated Sep. 24, 2020, issued in International Application No. PCT/KR2020/007923.
Extended European Search Report dated May 3, 2022, issued in European Patent Application No. 20844938.9.

\* cited by examiner

ELECTRONIC DEVICE INCLUDING A SHIELDING SHEET AND A HEAT RADIATION MEMBER

CROSS-REFERENCE TO RELATED APPLICATION(S)

This application is based on and claims priority under 35 U.S.C. § 119(a) of a Korean patent application number 10-2019-0090425, filed on Jul. 25, 2019, in the Korean Intellectual Property Office, the disclosure of which is incorporated by reference herein in its entirety.

BACKGROUND

1. Field

The disclosure relates to an electronic device. More particularly, the disclosure relates to a shielding structure disposed around electronic parts and having high heat dissipation performance.

2. Description of the Related Art

As mobile communication technology has developed, integrated electronic components for high performance have come to be mounted on a printed circuit board in electronic devices, such as a smartphone that has been popularized.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide electronic components mounted on a printed circuit board may generate heat and electromagnetic waves when they are operated. Heat and electromagnetic waves generated by electronic components may influence other electronic components in an electronic device, which may cause a malfunction of the electronic device.

Electronic devices of the related art block electronic waves generated by electronic components using a shield can made of a metal material and surrounding the electronic components.

However, shield cans of the related art have a problem that since the ability to transmit heat generated by electronic components is low, the heat is not efficiently discharged.

Another aspect of the disclosure is to provide an electronic device that blocks electromagnetic waves from electronic components and discharges heat of the electronic components.

Additional aspects will be set forth in electronic component in the description which follows and, in electronic component, will be apparent from the description, or may be learned by practice of the presented embodiments.

In accordance with an aspect of the disclosure, an electronic device is provided. The electronic device includes a circuit board, at least one electronic component mounted on a surface of the circuit board, a shielding sheet attached to the surface of the circuit board to cover the at least one electronic component, a thermal interface material stacked on the shielding sheet to overlap the at least one electronic component, and a heat dissipation member disposed to face the surface of the circuit board, being in surface contact with the thermal interface material, and fastened to at least a portion of the circuit board by a fixing member.

In accordance with another aspect of the disclosure, an electronic device is provided. The electronic device includes a housing, a circuit board disposed in a space in the housing, at least one first electronic component and at least one second electronic component formed on a first surface of the circuit board, a shielding sheet attached to the surface of the circuit board to cover the at least one first electronic component, a thermal interface material (TIM) stacked on the shielding sheet to overlap the at least one first electronic component, and a heat dissipation member disposed to face the surface of the circuit board, being in surface contact with the thermal interface material, and fastened to at least a portion of the circuit board.

An electronic device according to various embodiments can block electromagnetic waves of electronic components and can quickly discharge heat of the electronic components.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
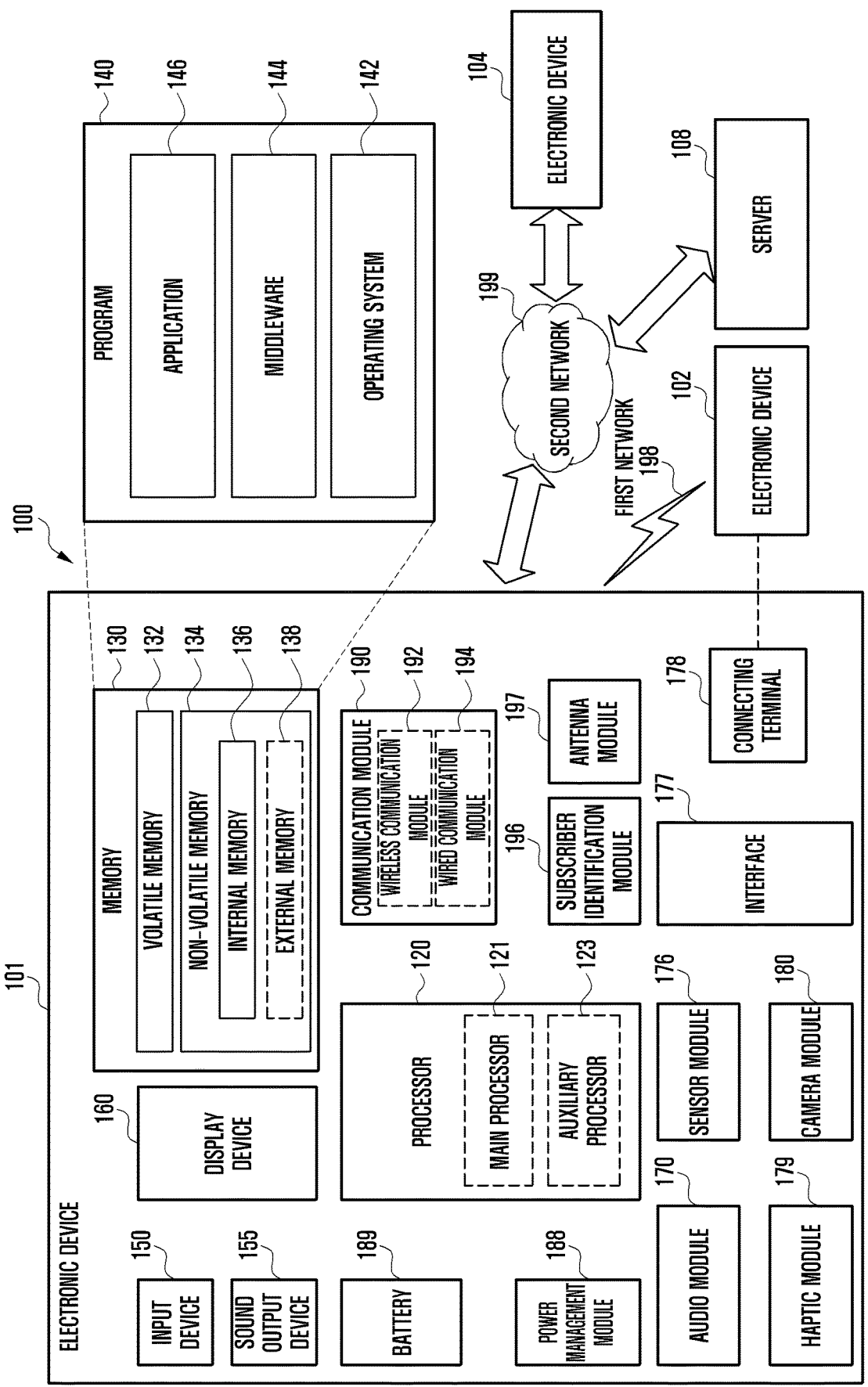
FIG. 1 is a block diagram of an electronic device in a network environment according to an embodiment of the disclosure.

FIG. 1 is a block diagram illustrating an electronic device in a network environment 100 according to an embodiment of the disclosure.

Referring to FIG. 1, an electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment of the disclosure, the electronic device 101 may communicate with the electronic device 104 via the server 108. According to an embodiment of the disclosure, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments of the disclosure, at least one (e.g., the display device 160 or the camera module 180) of the components may be omitted from the electronic device 101, or one or more other components may be added in the electronic device 101. In some embodiments of the disclosure, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment of the disclosure, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment of the disclosure, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment of the disclosure, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment of the disclosure, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture an image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment of the disclosure, the antenna module 197 may include an antenna including a radiating element composed of a conductive material or a conductive pattern formed in or on a substrate (e.g., PCB). According to an embodiment of the disclosure, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device according to various embodiments may include a circuit board (e.g., 340 in FIG. 3), at least one first electronic component (e.g., 341 in FIG. 3) mounted on a surface of the circuit board 340, a shielding sheet (e.g., 391 in FIG. 3) attached to the surface of the circuit board 340 to cover the at least one first electronic component 341, a thermal interface material (TIM) (e.g., 392 in FIG. 3) stacked on the shielding sheet 391 to overlap the at least one first electronic component 341, and a heat dissipation member (e.g., 393 in FIG. 3) disposed to face the surface of the circuit board 340, being in surface contact with the thermal interface material 392, and fastened to at least a portion of the circuit board 340 by a fixing member. The shielding sheet 391 may include an adhesive layer 711, an insulating layer 713, and a conductive layer 712 disposed between the adhesive layer 711 and the insulating layer 713. The adhesive layer 711 of the shielding sheet 391 is removed at the portion overlapping the at least one first electronic component 341, so a portion of the conductive layer 712 is exposed and the exposed portion of the conductive layer 712 can be in surface contact with the at least one first electronic component 341 disposed thereunder. The insulating layer 713 of the shielding sheet 391 is removed at the portion overlapping the at least one first electronic component 341, so a portion of the conductive layer 712 is exposed and the exposed portion of the conductive layer 712 can be in surface contact with the thermal interface material 392 disposed thereover. The conductive layer 712 may include a plurality of nanofibers plated with copper (Cu), graphite, or nickel (Ni). The conductive layer 712 may be in contact with a ground pad disposed on the surface of the circuit board 340 at the boundary of the shielding sheet 391. The heat dissipation member 393 may include a heat spreader 611 being in surface contact with the thermal interface material 392 and a fixing plate 612 supporting the heat spreader 611. The heat spreader 611 may be disposed between the fixing plate 612 and the thermal interface material 392. The fixing plate 612 is disposed between the heat spreader 611 and the thermal interface material 392 and has a groove exposing the heat spreader 611 at the portion overlapping the thermal transfer material 392, so the thermal transfer material 392 can be in surface contact with the heat spreader 611 through the groove. The heat spreader 611 may be a heat pipe or a vapor chamber. The fixing plate 612 may be made of any one of steel used stainless (SUS) or a copper alloy. The area of the thermal transfer material 392 may be the same as the area of the at least one first electronic component 341 and the area of the shielding sheet 391 may be larger than the area of the thermal interface material 392. The area of the heat dissipation member 393 may be larger than the area of the shielding sheet 391 and may be smaller than the area of the circuit board 340. The area of the heat dissipation member 393 may be 50 to 90% of the area of the circuit board 340. The fixing member may include a PEM™ nut formed on the circuit board 340 or the heat dissipation member 393 and a screw inserted in the PEM™ nut. At least one hole through which the screw is disposed may be formed in the circuit board 340 or the heat dissipation member 393. The at least one first electronic component 341 may include at least one of a central processing unit, an application processor, a graphic processing unit, an image signal processor, a sensor hub processor, a communication processor, a Power Amp Module (PAM), or a Power Management Integrated Circuit (PMIC). An air layer may be formed between the heat dissipation member 393 and the circuit board 340 in a region not overlapping the at least one first electronic component 341.

An electronic device according to various embodiments may include a housing, a circuit board 340 disposed in a space in the housing, the at least one first electronic component 341 and at least one second electronic component 343 formed on a surface of the circuit board 340, a shielding sheet 391 attached to the surface of the circuit board 340 to cover the at least one first electronic component 341, a thermal interface material 392 (TIM) stacked on the shielding sheet 391 to overlap the at least one first electronic component 341, and a heat dissipation member 393 disposed to face the surface of the circuit board 340, being in surface contact with the thermal interface material 392, and fastened to at least a portion of the circuit board 340 by a fixing member. The electronic device may further include a shield can (e.g., 411 in FIG. 4) covering the at least one second electronic component 343 on the surface of the circuit board 340.

Figure 2A:
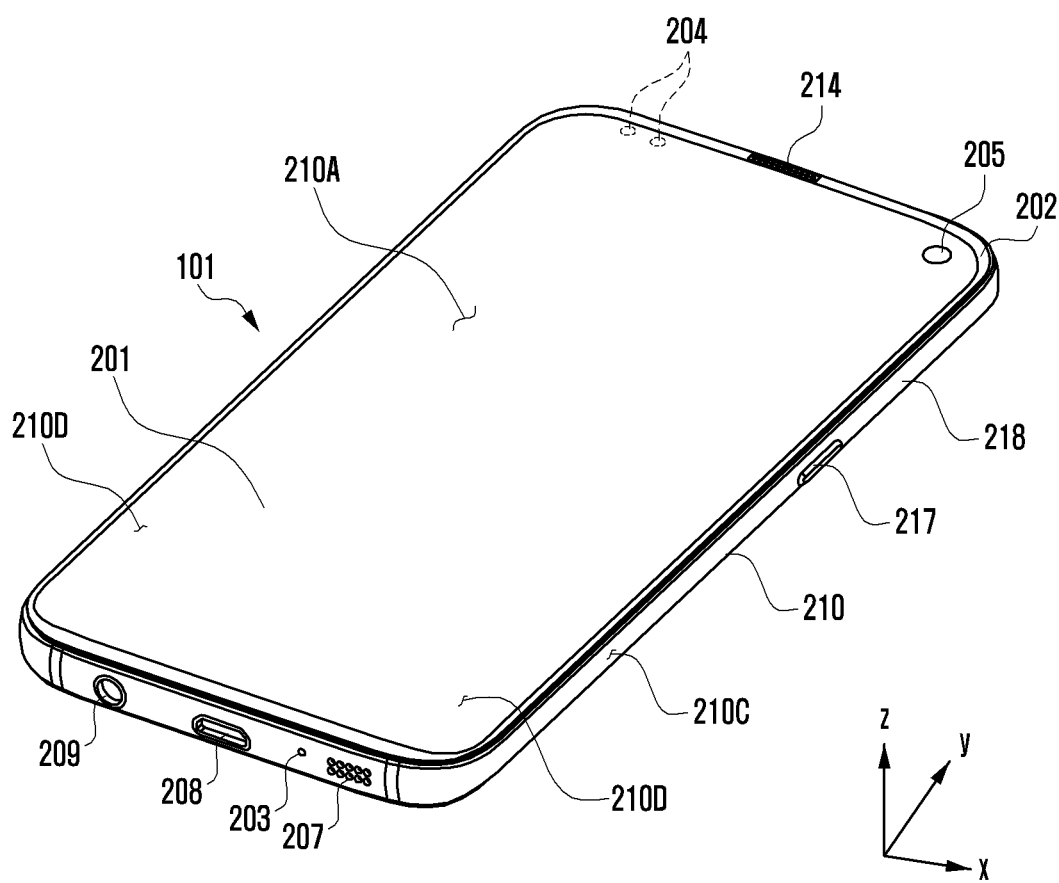
FIG. 2A is a front perspective view of a mobile electronic device according to an embodiment of the disclosure.

FIG. 2A is a front perspective view of a mobile electronic device according to an embodiment of the disclosure.

Figure 2B:
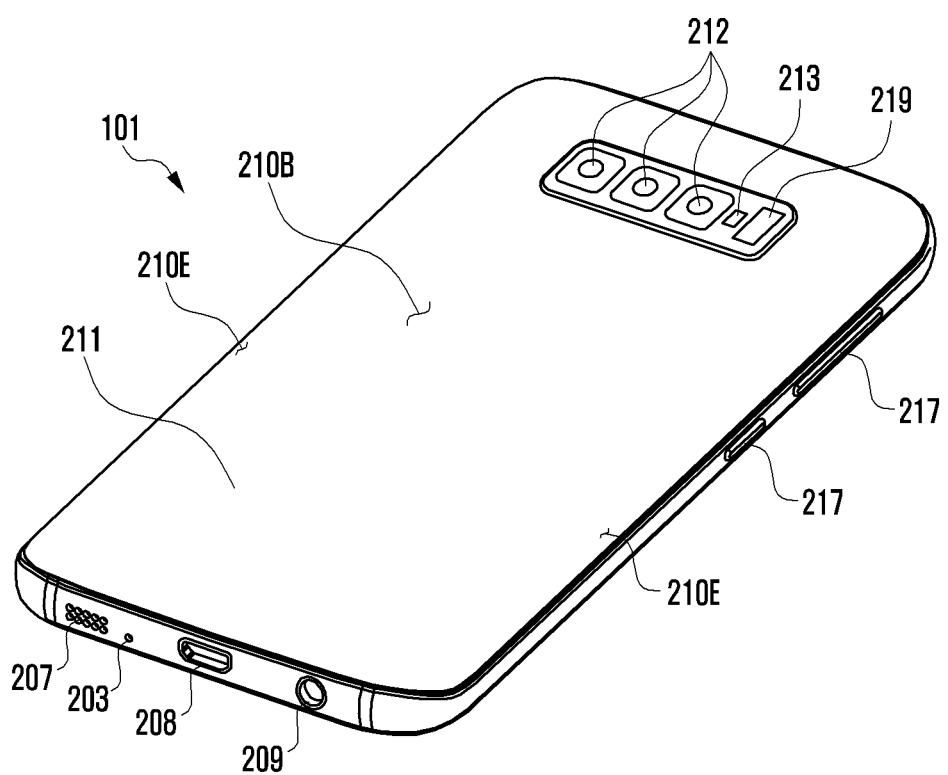
FIG. 2B is a rear perspective view of an electronic shown in FIG. 2A according to an embodiment of the disclosure.

FIG. 2B is a rear perspective view of an electronic device shown in FIG. 2A according to an embodiment of the disclosure.

Referring to FIGS. 2A and 2B, an electronic device 200 according to an embodiment may include a housing 210 having a first surface (or a front surface) 210A, a second surface (or a rear surface) 210B, and a side 210C surrounding the space between the first surface 210A and the second surface 210B. In another embodiment (not shown), the housing may mean a structure forming some of the first surface 210A, the second surface 210B, and the side 210C shown in FIG. 1. According to an embodiment of the disclosure, the first surface 210A may be at least partially substantially formed by a transparent front plate 202 (e.g., a glass plate or a polymer plate including various coating layers). The second surface 210B may be formed by a substantially opaque rear plate 211. The rear plate 211, for example, may be made of coated or colored glass, ceramic, a polymer, metal (e.g., aluminum, stainless steel (STS), or magnesium), or a combination of at least two of these materials. The side 210C is combined with a front plate 202 and a rear plate 211 and may be formed by a lateral bezel structure 218 (or a "lateral member") including metal and/or a polymer. In an embodiment of the disclosure, the rear plate 211 and the lateral bezel structure 218 may be integrated and may include the same material (e.g., a metallic material, such as aluminum).

In the embodiment shown in the figures, the front plate 202 may have first regions 210D, which bend toward the rear plate from the first surface 210A and seamlessly extend, at both long edges of the front plate. In the shown embodiment (see FIG. 2B), the rear plate 211 may have second regions 210E, which bend toward the front plate from the second surface 210B and seamlessly extend, at both long edges. In an embodiment of the disclosure, the front plate 202 or the rear plate 211 may have only one of the first regions 210D or the second regions 210E. In an embodiment of the disclosure, the front plate 202 may have only a flat surface disposed in parallel with the second surface 210B without including the first region and the second region. In the embodiments of the disclosure, when seen from a side of the electronic device, the side bezel structure 218 may have a first thickness (or width) at the sides not including the first regions 210D or the second regions 210E and may have a second thickness smaller than the first thickness at the sides including the first regions or the second regions.

According to an embodiment of the disclosure, the electronic device 200 may include at least one or more of a display 201, an input device 203, sound output devices 207 and 214, sensor modules 204 and 219, camera modules 205, 212, and 213, key input devices 217, an indicator (not shown), and connectors 208 and 209. In an embodiment of the disclosure, the electronic device 200 may not include at least one (e.g., the key input devices 217 or the indicator) of the components or may further include other components.

According to an embodiment of the disclosure, the display 201, for example, may be exposed through a large part of the front plate 202. In an embodiment of the disclosure, at least a portion of the display 201 may be exposed through the first surface 210A and the front plate 202 forming the first regions 210D of the side 210C. The display 201 may be combined with or disposed adjacent to a touch sensing circuit, a pressure sensor that can measure the intensity (pressure) of a touch, and/or a digitizer that detects a magnetic stylus pen. In an embodiment of the disclosure, at least some of the sensor modules 204, 219 and/or at least some of the key input devices 217 may be disposed in the first region 210D and/or the second region 210E.

According to an embodiment of the disclosure, the input device 203 may include a microphone 203. In an embodiment of the disclosure, the input device 203 may include a plurality of microphones 203 disposed to be able to sense the direction of sound. The sound output devices 207 and 214 may include speakers 207 and 214. The speakers 207 and 214 may include an external speaker 207 and a receiver 214 for a telephone call. In an embodiment of the disclosure, the microphone 203, the speakers 207 and 214, and the connectors 208 and 209 may be disposed in the space of the electronic device 200 and may be exposed to the external environment through at least one hole formed at the housing 210. In an embodiment of the disclosure, the hole of the housing 210 may be used in common for the microphone 203 and the speakers 207 and 214. In an embodiment of the disclosure, the sound output devices 207 and 214 may include a speaker (e.g., a piezo speaker) without the hole of the housing 210.

According to an embodiment of the disclosure, the sensor modules 204 and 219 can generate an electrical signal or a data value corresponding to the internal operation state of the electronic device 200 or an external environmental state. The sensor modules 204 and 219, for example, may include a first sensor module 204 (e.g., a proximity sensor) disposed on the first surface 210A of the housing 210 and/or a second sensor module (not shown) (e.g., a fingerprint sensor), and/or a third sensor module 219 (e.g., an HRM sensor) disposed on the second surface 210B of the housing 210. The fingerprint sensor may be disposed on the first surface 210A (e.g., a home key button 215), in a partial region of the second surface 210B of the housing 210, or under the display 201. The electronic device 200 may further include a sensor module (not shown), for example, at least one of a gesture sensor, a gyro sensor, a barometer sensor, a magnetic sensor, an acceleration sensor, a grip sensor, a color sensor, an IR (Infrared) sensor, a biosensor, a temperature sensor, a humidity sensor, or an illumination sensor 204.

According to an embodiment of the disclosure, the camera modules 205, 212, and 213 may include a first camera 205 disposed on the first surface 210A of the electronic device 200, and a second camera 212 and/or a flash 213 disposed on the second surface 210B. The camera modules 205 and 212 may include one or more lenses, an image sensor, and/or an image signal processor. A flash 213, for example, may include a light emitting diode or a xenon lamp. In an embodiment of the disclosure, two or more lenses (a wide-angle lens, an ultra wide lens, or a telephoto lens) and image sensors may be disposed on one surface of the electronic device 200.

According to an embodiment of the disclosure, the key input device 217 may be disposed on the side 210C of the housing 210. In another embodiment of the disclosure, the electronic device 200 may not include some or all of the key input devices 217 described above and the non-included key input devices 217 may be implemented in other types, such as software keys on the display 201. As another embodiment of the disclosure, the key input devices 217 may be implemented using the pressure sensor included in the display 201.

According to an embodiment of the disclosure, the indicator, for example, may be disposed on the first surface 210A of the housing 210. The indicator, for example, may provide state information of the electronic device 200 in a light type. In another embodiment of the disclosure, the light emitting element, for example, may provide a light source that operates with the operation of the camera module 205. The indicator, for example, may include an LED, an IR LED, and a xenon lamp.

According to an embodiment of the disclosure, the connectors 208 and 209 may include a first connector hole 208 that can accommodate a connector (e.g., a USB connector) for transmitting and receiving power and/or data to and from external electronic devices and/or a second connector hole 209 (or an earphone jack) that can accommodate a connector for transmitting and receiving audio signals to and from external electronic devices.

According to an embodiment of the disclosure, a camera module 205 of the camera modules 205 and 212, a sensor module 204 of the sensor modules 204 and 219, or the indicator may be disposed to be exposed through a display 201. For example, the camera module 205, the sensor module 204, or the indicator may be disposed to be able to be in contact with the external environment through a through-hole bored to a front plate 202 of the display 201 in the internal space of an electronic device 200. As another embodiment of the disclosure, the sensor module 204 may be disposed in the internal space of the electronic device to perform its function without being visually exposed through the front plate 202. For example, in this case, there may be no need for a through-hole in a region facing the sensor module.

Figure 3:
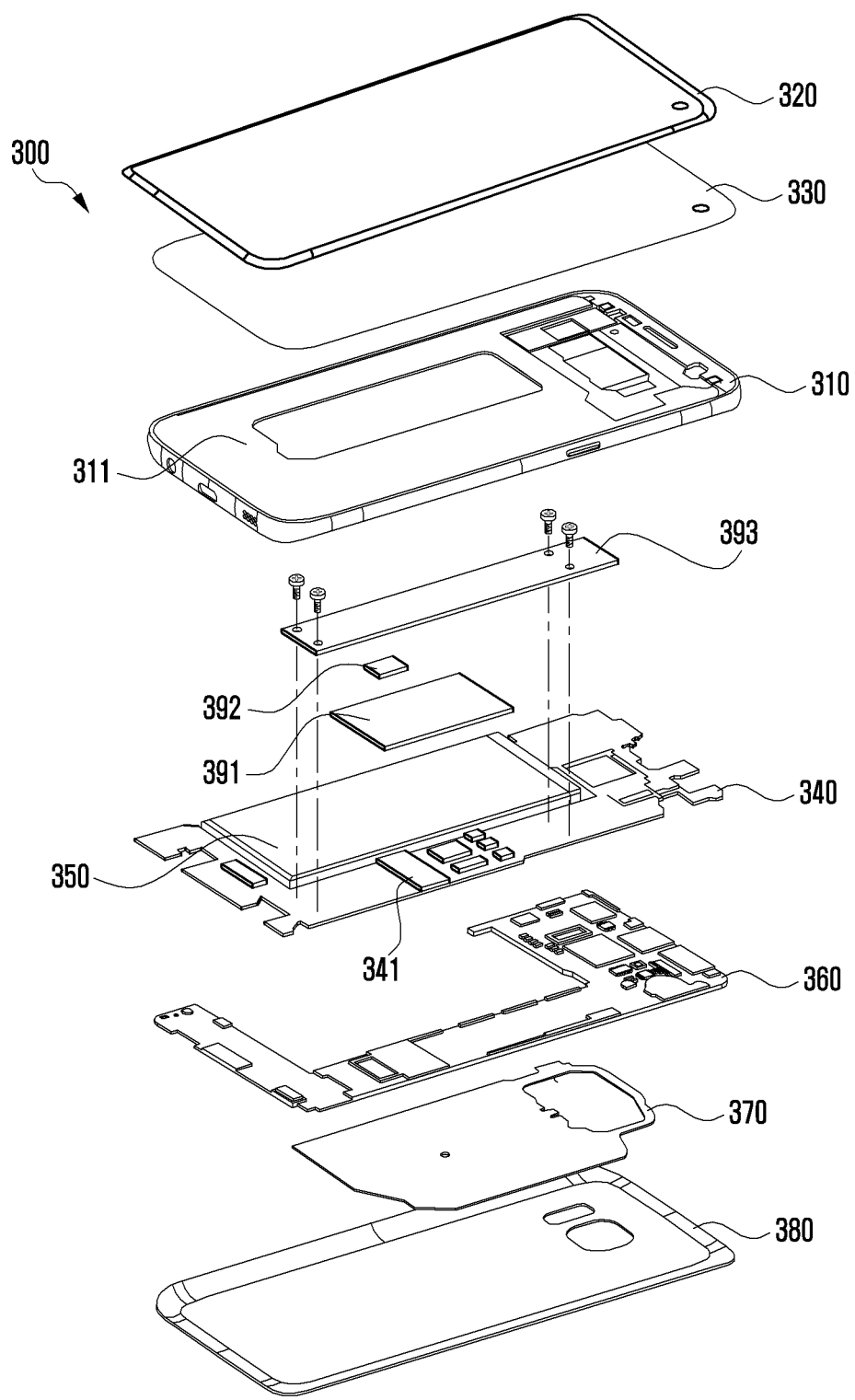
FIG. 3 is an exploded perspective view of an electronic device shown in FIGS. 2A and 2B according to an embodiment of the disclosure.

FIG. 3 is an exploded perspective view of an electronic device shown in FIGS. 2A and 2B according to an embodiment of the disclosure.

An electronic device 300 shown in FIG. 3 is at least partially similar to the electronic device 100 shown in FIGS. 2A and 2B or may include another embodiment of an electronic device.

Referring to FIG. 3, the electronic device 300 (e.g., the electronic device 100 shown in FIG. 2A or 2B) may include a side member 310 (e.g., a lateral bezel structure), a first supporting member 311 (e.g., a bracket or a supporting structure), a front plate 320 (e.g., a front cover), a display 330, a printed circuit board 340, a battery 350, a second supporting member 360 (e.g., a bracket or a supporting structure), an antenna 370, and a rear plate 380 (e.g., a rear cover, the rear plate 211 shown in FIG. 2B). In an embodiment of the disclosure, the electronic device 300 may not include at least one (e.g., the first supporting member 311 or the second supporting member 360) of the components, or may further include other components. At least one of the components of the electronic device 300 may be the same as or similar to at least one of the components of the electronic device 100 shown in FIG. 2A or FIG. 2B and repeated description is omitted below.

According to an embodiment of the disclosure, the first supporting member 311 is disposed in the electronic device 300 and may be connected with the lateral member 310 or may be integrated with the lateral member 310. The first supporting member 311, for example, may be made of a metallic material and/or a non-metallic material (e.g., a polymer). The display 330 may be coupled to a surface of the first supporting member 311 and the printed circuit board 340 may be coupled to the other surface of the first supporting member 311.

According to an embodiment of the disclosure, at least one or more of a central processing unit, an application processor, a graphic processing unit, an image signal processor, a sensor hub processor, a communication processor, a Power Amp Module (PAM), a charging IC, or a Power Management Integrated Circuit (PMIC) may be mounted on a surface of the printed circuit board 340. According to an embodiment of the disclosure, a memory (not shown) (e.g., 130 in FIG. 1) or an interface (not shown) (e.g., 177 in FIG. 1) may be further mounted on a surface of the printed circuit board 340.

According to an embodiment of the disclosure, a shielding member (e.g., the shielding sheet 391 shown in FIG. 3 or the shield can 411 shown in FIG. 4), a thermal interface material (TIM) 392, and a heat dissipation member 393 may be stacked over a surface of the printed circuit board 340 to overlap the at least one first electronic component 341 mounted on the printed circuit board 340.

According to an embodiment of the disclosure, the shielding member may be a shielding sheet 391 or a shield can (e.g., 411 in FIG. 4) covering at least one electronic component. According to an embodiment of the disclosure, the shielding sheet 391 may be attached to cover the at least one first electronic component (e.g., 341 in FIG. 4) mounted on the printed circuit board 340 and the shield can (e.g., 411 in FIG. 4) may cover at least one second electronic component (e.g., 343 in FIG. 4) mounted on the printed circuit board 340. According to various embodiments of the disclosure, the first electronic component may be an electronic component that generates a large amount of heat or has a high operation speed (e.g., an operation clock) in comparison to the second electronic component. For example, the first electronic component may be a central processing unit, an application processor, a graphic processing unit, or an image signal processor that generates a relatively large amount of heat and has a relatively high operation speed, and the second electronic component may be the other excluding the first electronic component.

According to an embodiment of the disclosure, the thermal interface material (TIM) 392 may be stacked over the shielding sheet 391 to overlap the at least one first electronic component 341.

According to an embodiment of the disclosure, the heat dissipation member 393 may be disposed to face a surface of the printed circuit board 340 and may be in surface contact with the thermal interface material 392. According to an embodiment of the disclosure, the heat dissipation member 393 can receive heat generated from the at least one first electronic component 341 through the thermal interface material 392 and can diffuse the received heat.

According to an embodiment of the disclosure, the heat dissipation member 393 may be fastened to at least a portion of the printed circuit board by a fixing member. For example, the fixing member may include a PEM™ nut (e.g., the PEM™ nut 631 shown in FIG. 6) formed on the printed circuit board 340 or the heat dissipation member, and a screw 394 inserted in the PEM™ nut.

The stacking structure of the shielding member 391, the thermal interface material (TIM) 392, and the heat dissipation member 393 according to various embodiments will be described below with reference to FIGS. 6 to 9.

According to an embodiment of the disclosure, the interface may include a High Definition Multimedia Interface (HDMI), a Universal Serial Bus (USB) interface, an SD card interface, and/or an audio interface. The interface, for example, can electrically or physically connect the electronic device 300 to external electronic devices and may include a USB connector, an SD card/MMC connector, or an audio connector.

According to an embodiment of the disclosure, the battery 350, which is a device for supplying power to one or more components of the electronic device 300, for example, may include a primary battery that is not rechargeable, a secondary battery that is rechargeable, or a fuel cell. At least a portion of the battery 350, for example, may be disposed in substantially the same plane as the printed circuit board 340. The battery 350 may be integrally disposed in the electronic device 300. As another embodiment of the disclosure, the battery 350 may be disposed to be detachable from the electronic device 300.

According to an embodiment of the disclosure, the antenna 370 may be disposed between the rear plate 380 and the battery 350. The antenna 370, for example, may include a Near Field Communication (NFC) antenna, a wireless charging antenna, and/or a Magnetic Secure Transmission (MST) antenna. The antenna 370, for example, can perform near field communication with external devices or can wirelessly transmit and receive power for charging. In another embodiment of the disclosure, an antenna structure may be formed by a portion or a combination of the lateral bezel structure 310 and/or the first supporting member 311.

Figure 4:
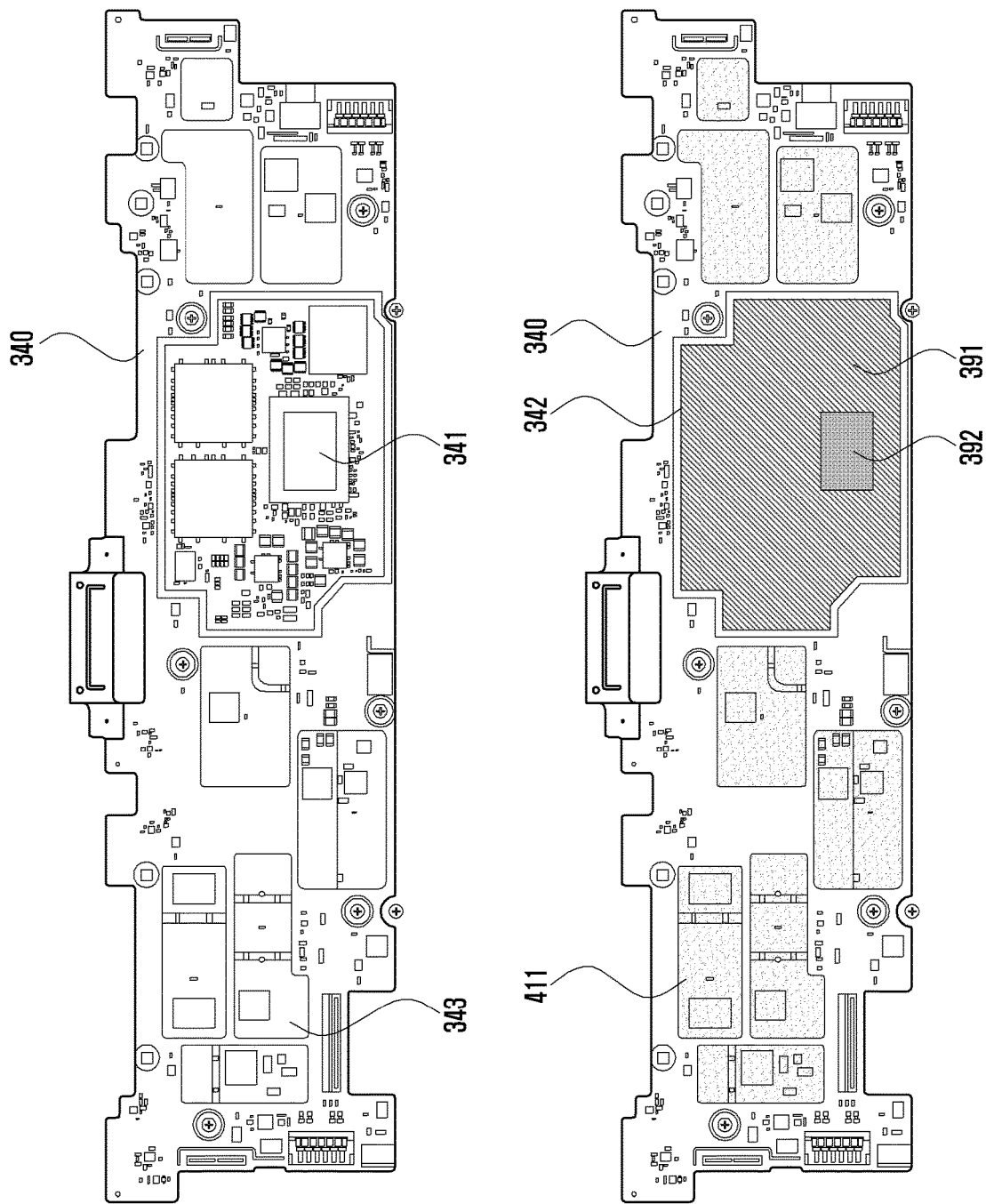
FIG. 4 illustrates a surface of a printed circuit board according to an embodiment of the disclosure.

FIG. 4 illustrates a surface of a printed circuit board according to an embodiment of the disclosure.

Referring to FIG. 4, at least one first electronic component 341 generating a relatively large amount of heat or having a relatively high operation speed (e.g., an operation clock) may be mounted on a surface of the printed circuit board 340 (e.g., 340 in FIG. 3) according to various embodiments. At least one second electronic component 343 generating a relatively small amount of heat or having a relatively low operation speed (e.g., an operation clock) may be mounted on a surface of the printed circuit board 340 according to various embodiments.

According to various embodiments of the disclosure, shielding members 411 and 391 covering the at least one first electronic component 341 and the at least one second 343 mounted on the printed circuit board 340 may be stacked over the printed circuit board 340. According to an embodiment of the disclosure, the shielding members 411 and 391 may be a shielding sheet 391 or a shield can 422 covering the at least one first electronic component 341. According to an embodiment of the disclosure, the shielding sheet 391 may be attached to cover the at least one first electronic component 341 mounted on the printed circuit board 340 and the shield can 411 may cover the at least one second electronic component 343 mounted on the printed circuit board 340.

According to various embodiments of the disclosure, in the printed circuit board 340, a thermal interface material 392 may be stacked over the shielding sheet 391 and the thermal interface material 392 may be arranged to overlap the at least one first electronic component 341 generating a relatively large amount of heat or having a relatively high operation speed (e.g., operation clock).

According to various embodiments of the disclosure, the area of the thermal interface material 392 may be substantially the same as the area of the at least one first electronic component 341.

According to various embodiments of the disclosure, the area of the shielding sheet 391 may be larger than the area of the thermal interface material 392.

Figure 5:
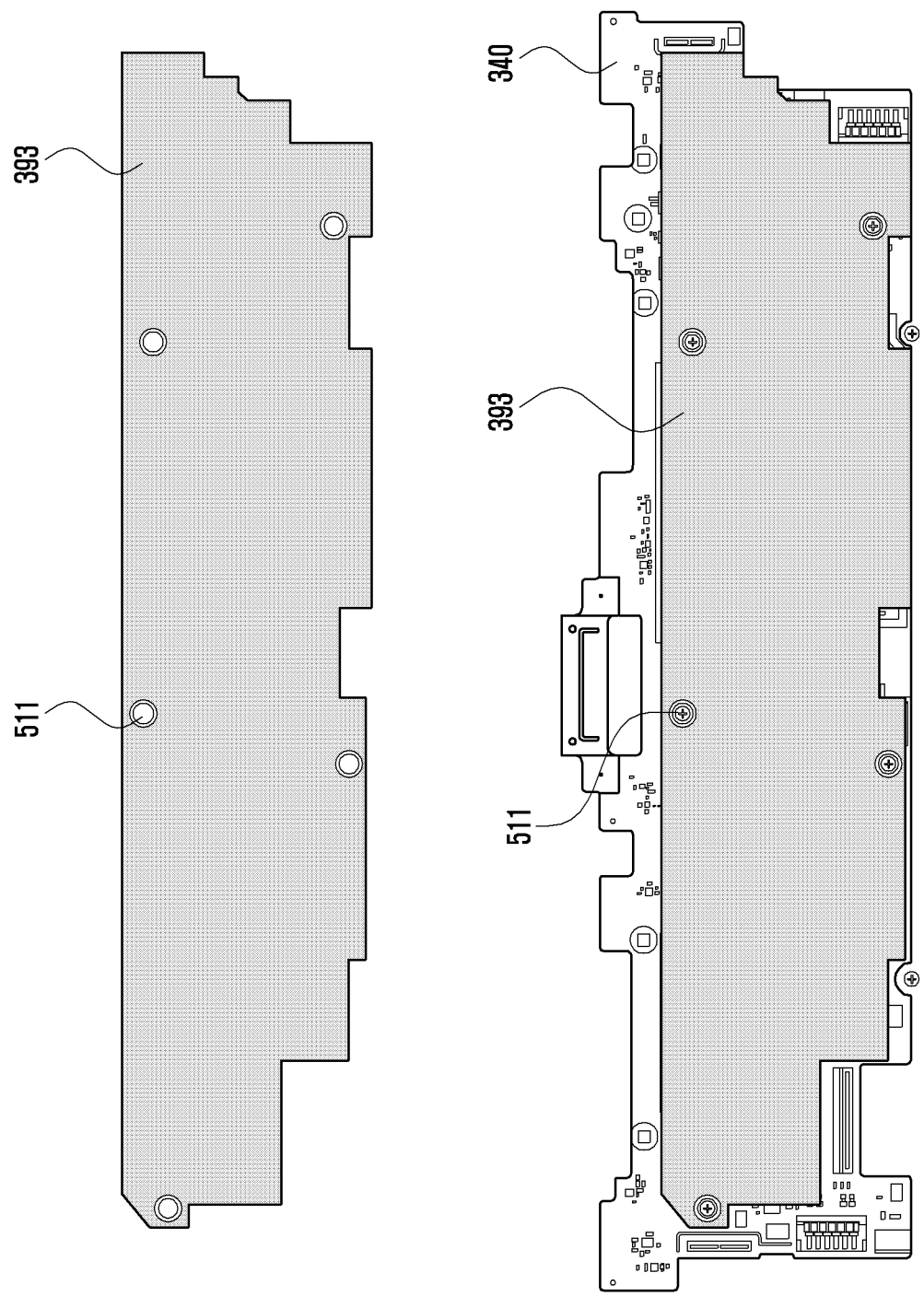
FIG. 5 illustrates comparing an area of a printed circuit board and an area of a heat dissipation member according to an embodiment of the disclosure.

FIG. 5 illustrates comparing an area of a printed circuit board and an area of a heat dissipation member according to an embodiment of the disclosure.

Referring to FIG. 5, the area of the heat dissipation member 393 (e.g., 393 in FIG. 3) according to an embodiment may be larger than the area of the shielding sheet 391 (e.g., 391 in FIG. 3) and may be smaller than the area of the printed circuit board 340 (e.g., 340 in FIG. 3). According to an embodiment of the disclosure, the area of the heat dissipation member 393 may be 50 to 90% of the area of the printed circuit board 340. According to an embodiment having this configuration, it is possible to quickly transmit heat that is generated from a portion mounted on the printed circuit board 340, for example, a processor (e.g., the processor 120 shown in FIG. 1) to the heat dissipation member 393 through the thermal interface material 392, and it is also possible to quickly dissipate heat and secure the stability of a product by allocating a large area to the heat dissipation member 393. According to an embodiment of the disclosure, at least one through-hole 511 in which a screw (e.g., the screw 394 shown in FIG. 3) for fastening the heat dissipation member 393 to the printed circuit board 340 is disposed may be formed at the heat dissipation member 393.

Figure 6:
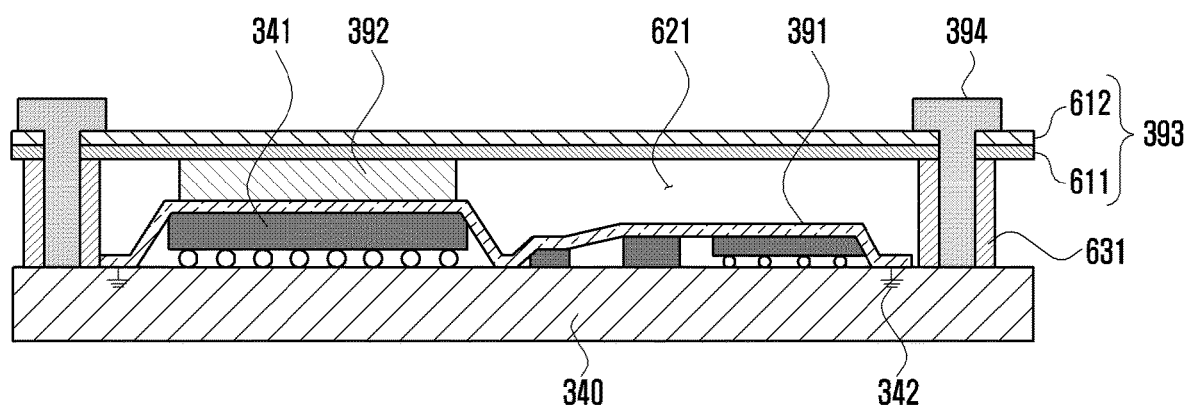
FIG. 6 is a cross-sectional assembly view of a printed circuit board according to an embodiment of the disclosure.
Figure 7:
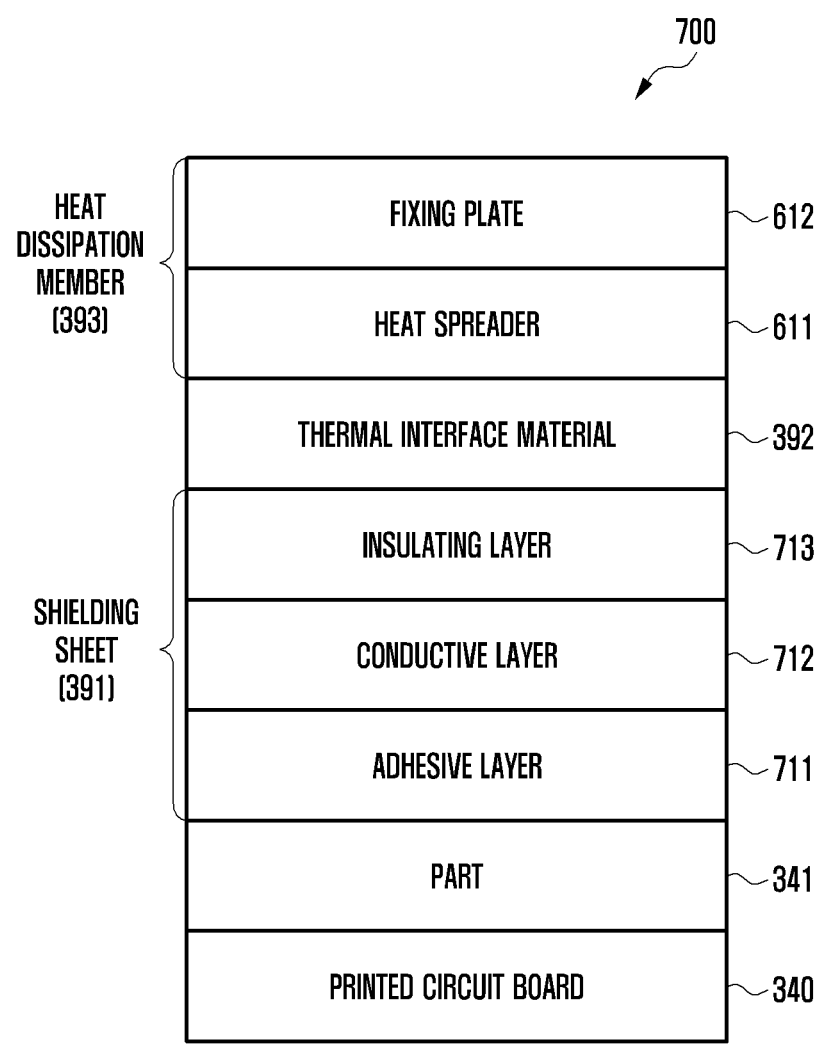
FIG. 7 is a view schematically illustrating a cross-sectional structure of a printed circuit board shown in FIG. 6 according to an embodiment of the disclosure.

FIG. 6 is a cross-sectional assembly view of a printed circuit board according to an embodiment of the disclosure. FIG. 7 is a view 700 illustrating a cross-sectional structure of a printed circuit board shown in FIG. 6 according to an embodiment of the disclosure. Hereafter, a shielding structure and a heat dissipation structure of a printed circuit board according to an embodiment are described with reference to FIGS. 6 and 7.

Referring to FIGS. 6 and 7, the at least one first electronic component 341 is mounted on a surface of a printed circuit board 340 (e.g., 340 in FIG. 3), and a shielding sheet 391 (e.g., 391 in FIG. 3), a thermal interface material 392 (e.g., 392 in FIG. 3), and a heat dissipation member 393 (e.g., 393 in FIG. 3) may be sequentially stacked on the at least one first electronic component 341.

According to an embodiment of the disclosure, the shielding sheet 391 is attached to cover the at least one first electronic component 341 and can block an Electro Magnetic Interference (EMI) noise that is generated from the covered at least one first electronic component 341. According to an embodiment of the disclosure, the shielding sheet 391 may include an adhesive layer 711, an insulating layer 713, and a conductive layer 712 disposed between the adhesive layer 711 and the insulating layer 713.

According to an embodiment of the disclosure, the conductive layer 712 may include a plurality of nanofibers plated with copper (Cu), graphite, or nickel (Ni). According to an embodiment of the disclosure, the conductive layer 712 is in contact with a ground pad 342 disposed on the surface of the printed circuit board 340 at the boundary of the shielding sheet 391, thereby being able to block EMI noise generated from the at least one first electronic component 341.

According to various embodiments of the disclosure, the adhesive layer 711 of the shielding sheet 391 is removed at the portion overlapping the at least one first electronic component 341, so the conductive layer 712 of the shielding sheet 391 and the at least one first electronic component 341 can be directly in surface contact with each other. For example, the adhesive layer 711 of the shielding sheet 391 is removed at the portion overlapping the at least one first electronic component 341, so a portion of the conductive layer 712 is exposed and the exposed portion of the conductive layer 712 can be in surface contact with the at least one first electronic component 341 disposed thereunder. According to various embodiments of the disclosure, a thermal interface material may be provided instead of the adhesive material of the adhesive layer 711 at the portion of the shielding sheet 391 which overlaps the at least one first electronic component 341. According to various embodiments of the disclosure, since the insulating layer 713 of the shielding sheet 391 is removed at the portion overlapping the at least one first electronic component 341, the conductive layer 712 of the shielding sheet 391 and the thermal interface material 392 can be directly in surface contact with each other. For example, the insulating layer 713 of the shielding sheet 391 is removed at the portion overlapping the at least one first electronic component 341, so a portion of the conductive layer 712 is exposed and the exposed portion of the conductive layer 712 can be in surface contact with the thermal interface material 392 disposed thereover. According to various embodiments of the disclosure, a thermal interface material may be provided instead of the insulating material of the adhesive layer 713 at the portion of the shielding sheet 391 which overlaps the at least one first electronic component 341.

According to an embodiment of the disclosure, the heat dissipation member 393 may be disposed to face a surface of the printed circuit board 340 and may be in surface contact with the thermal interface material 392. According to an embodiment of the disclosure, the heat dissipation member 393 can receive heat generated from the at least one first electronic component 341 through the thermal interface material 392 and can diffuse the received heat.

According to an embodiment of the disclosure, the heat dissipation member 393 may include a heat spreader 611 and a fixing plate 612.

According to an embodiment of the disclosure, the heat spreader 611 may be a heat pipe or a vapor chamber. According to an embodiment of the disclosure, the heat spreader 611 may be disposed between the fixing plate 612 and the thermal interface material 392 and may be in surface contact with the thermal interface material 392.

According to an embodiment of the disclosure, the fixing plate 612 is stacked over the heat spreader 611 and can fix the heat dissipation member 393 in a flat plate shape. According to an embodiment of the disclosure, the fixing plate 612 may be made of Steel Used Stainless (SUS) or an alloy. According to an embodiment of the disclosure, the alloy may be a copper alloy. For example, the alloy may be a metal alloy obtained by mixing a small amount of tin or phosphorous in copper that is the base metal.

According to an embodiment of the disclosure, the heat dissipation member 393 may be fastened to at least a portion of the circuit board 340 by a fixing member. For example, the fixing member may include a PEM™ nut (e.g., the PEM™ nut 631 shown in FIG. 6) formed on the printed circuit board 340 or the heat dissipation member 393, and a screw 394 inserted in the PEM™ nut. According to an embodiment having this configuration, it is possible to increase the shielding ability and the heat dissipation ability and to secure fastening strength, thereby being able to increase the reliability of a product.

According to various embodiments of the disclosure, an air layer 621 may be formed between the heat dissipation member 393 and the printed circuit board 340 in a region not overlapping the at least one first electronic component 341.

Figure 8:
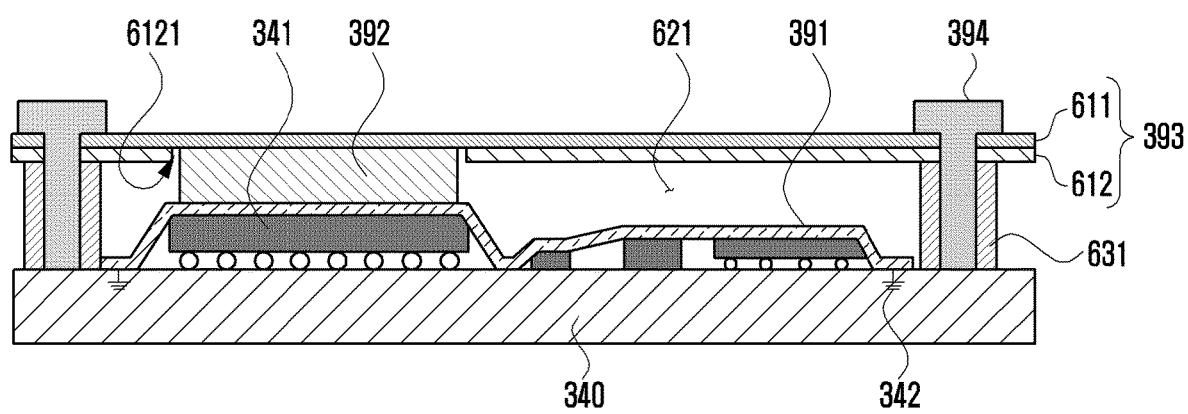
FIG. 8 is a cross-sectional assembly view of a printed circuit board according to an embodiment of the disclosure.
Figure 9:
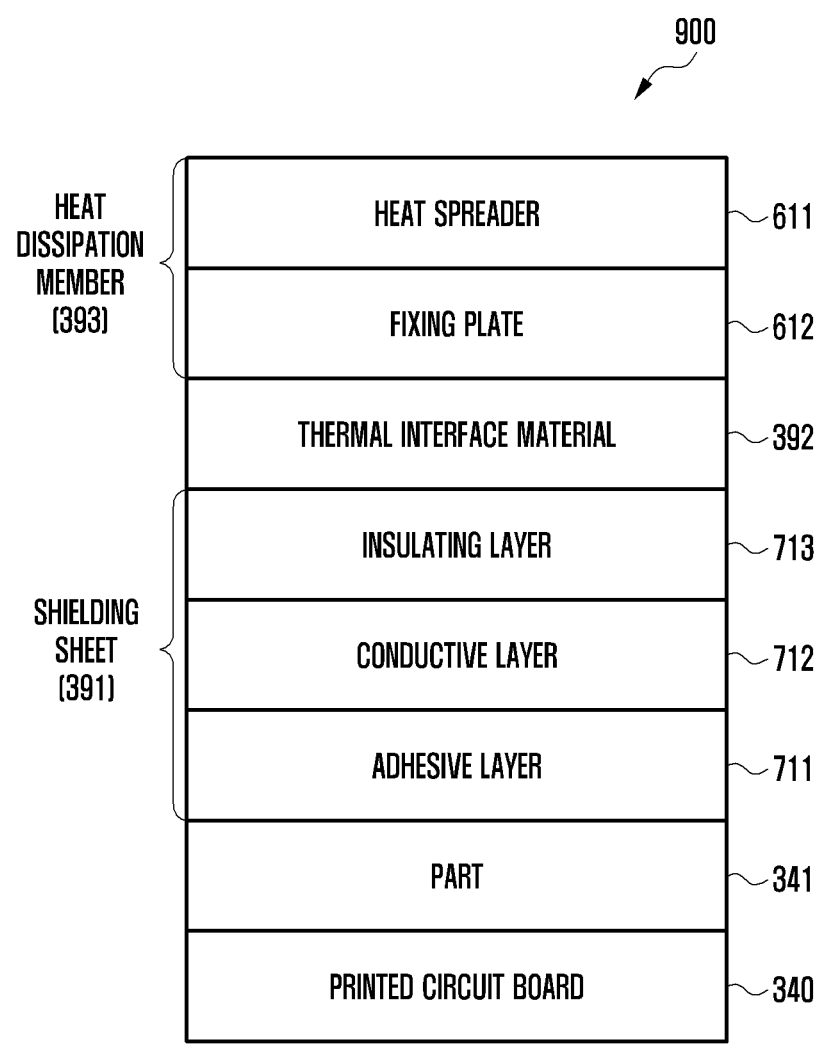
FIG. 9 illustrates a cross-sectional structure of a printed circuit board shown in FIG. 8 according to an embodiment of the disclosure.

FIG. 8 is a cross-sectional assembly view of a printed circuit board according to an embodiment of the disclosure. FIG. 9 is a view 900 schematically illustrating a cross-sectional structure of a printed circuit board shown in FIG. 8 according to an embodiment of the disclosure. Hereafter, a shielding structure and a heat dissipation structure of a printed circuit board 340 according to an embodiment are described with reference to FIGS. 8 and 9.

According to various embodiments of the disclosure, the stacking order of the heat dissipation member 393 (e.g., 393 in FIG. 3) is not limited to that shown in FIGS. 6 and 7 and can be changed in various ways. For example, the stacking order of the heat dissipation member 393 may be changed like that shown in FIGS. 8 and 9.

Referring to FIGS. 8 and 9, the fixing plate 612 of the heat dissipation member 393 may be disposed between the heat spreader 611 and the thermal interface material 392. For example, the heat dissipation member 393 may include a fixing plate 612 disposed over the thermal interface material 392 and a heat spreader 611 stacked over the fixing plate 612.

According to various embodiments of the disclosure, the fixing plate 612 may be disposed between the heat spreader 611 and the thermal interface material 392 and a groove 6121 exposing the heat spreader 611 may be formed at the portion overlapping the thermal interface material 392.

According to various embodiments of the disclosure, the thermal interface material 392 may be in surface contact with the heat spreader 611 through the groove 6121. According to an embodiment of the disclosure, the area of the groove 6121 may be larger than the area of the thermal interface material 392.

Components not described with reference to FIGS. 8 and 9 may be substantially the same as the components described with reference to FIGS. 6 and 7. Accordingly, for a description of FIGS. 6 and 7, reference is to be made to the description of components not described with reference to FIGS. 8 and 9.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

While the disclosure has been shown described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a circuit board;
   at least one electronic component mounted on a surface of the circuit board, the at least one electronic component comprising a first electronic component and at least one second electronic component;
   a shielding sheet attached to the surface of the circuit board and covering the at least one electronic component, the shielding sheet contacting a top surface of the first electronic component at a first height from the circuit board, a top surface of the at least one second electronic component at a second height from the circuit board different from the first height, and the circuit board in a region between the first electronic component and the at least one second electronic component;
   a thermal interface material (TIM) stacked on the shielding sheet and overlapping the at least one electronic component; and
   a heat dissipation member facing the surface of the circuit board, the heat dissipation member being in surface contact with the TIM and fastened to at least a portion of the circuit board by a fixing member,
   wherein the shielding sheet comprises an adhesive layer, an insulating layer, and a conductive layer disposed between the adhesive layer and the insulating layer,
   wherein the insulating layer is removed from a portion of the shielding sheet overlapping the at least one electronic component, and
   wherein a portion of the conductive layer is exposed and is in surface contact with the TIM, the TIM being disposed above the portion of the conductive layer.

2. The electronic device of claim 1,
   wherein the adhesive layer is removed from a portion of the shielding sheet overlapping the at least one electronic component, and
   wherein a portion of the conductive layer is exposed and is in surface contact with the at least one electronic component, the at least one electronic component being disposed under the portion of the conductive layer.

3. The electronic device of claim 1, wherein the conductive layer comprises a plurality of nanofibers plated with copper (Cu), graphite, or nickel (Ni).

4. The electronic device of claim 1, wherein the conductive layer is in contact with a ground pad disposed on the surface of the circuit board at a boundary of the shielding sheet.

5. The electronic device of claim 1, wherein the heat dissipation member comprises:
   a heat spreader in surface contact with the TIM; and
   a fixing plate fixing the heat spreader.

6. The electronic device of claim 5, wherein the heat spreader is disposed between the fixing plate and the TIM.

7. The electronic device of claim 5,
   wherein the fixing plate is disposed between the heat spreader and the TIM and has a groove exposing the heat spreader at a portion overlapping the TIM, and
   wherein the TIM is in surface contact with the heat spreader through the groove.

8. The electronic device of claim 5, wherein the heat spreader comprises a heat pipe or a vapor chamber.

9. The electronic device of claim 5, wherein the fixing plate comprises any one of steel used stainless (SUS) or a copper alloy.

10. The electronic device of claim 5,
    wherein the heat spreader comprises a heat pipe or a vapor chamber, and
    wherein a majority of a surface area of a surface of the heat spreader contacts a majority of a surface area of a surface of the fixing plate.

11. The electronic device of claim 1,
    wherein an area of the TIM comprises a same area as an area of the at least one electronic component, and
    wherein an area of the shielding sheet is larger than the area of the TIM.

12. The electronic device of claim 11, wherein an area of the heat dissipation member is larger than the area of the shielding sheet and smaller than an area of the circuit board.

13. The electronic device of claim 11, wherein an area of the heat dissipation member comprises 50% to 90% of an area of the circuit board.

14. The electronic device of claim 1,
    wherein the fixing member includes a nut formed on the circuit board or the heat dissipation member, and
    wherein a screw is inserted in the nut.

15. The electronic device of claim 14, wherein at least one hole through which the screw is disposed is formed in the circuit board or the heat dissipation member.

16. The electronic device of claim 1, wherein the at least one electronic component comprises at least one of a central processing unit, an application processor, a graphic processing unit, an image signal processor, a sensor hub processor, a communication processor, a power amp module (PAM), or a power management integrated circuit (PMIC).

17. The electronic device of claim 1, wherein an air layer is formed between the heat dissipation member and the circuit board in a region not overlapping the at least one electronic component.

* * * * *